(12) United States Patent
Komljenovic et al.

(10) Patent No.: US 8,970,945 B2
(45) Date of Patent: Mar. 3, 2015

(54) MODULATION AVERAGING REFLECTORS

(71) Applicants: Tin Komljenovic, Zagreb (HR); Dubravko Ivan Babic, Santa Clara, CA (US)

(72) Inventors: Tin Komljenovic, Zagreb (HR); Dubravko Ivan Babic, Santa Clara, CA (US)

(73) Assignee: University of Zagreb, Faculty of Electrical Engineering and Computing, Zagreb (HR)

( * ) Notice: Subject to any disclaimer, the term of this patent is extended or adjusted under 35 U.S.C. 154(b) by 0 days.

(21) Appl. No.: 13/947,106

(22) Filed: Jul. 22, 2013

(65) Prior Publication Data

US 2014/0029083 A1     Jan. 30, 2014

Related U.S. Application Data

(60) Provisional application No. 61/674,855, filed on Jul. 24, 2012.

(51) Int. Cl.

| | |
|---|---|
| *H01S 5/50* | (2006.01) |
| *H01S 5/04* | (2006.01) |
| *G02B 6/00* | (2006.01) |
| *H04B 10/2587* | (2013.01) |
| *H04B 10/272* | (2013.01) |
| *G02B 6/293* | (2006.01) |
| *H01S 5/065* | (2006.01) |
| *G02B 6/12* | (2006.01) |

(52) U.S. Cl.
CPC . *H01S 5/041* (2013.01); *G02B 6/00* (2013.01); *H01S 5/0656* (2013.01); *H04B 10/2587* (2013.01); *H04B 10/272* (2013.01); *G02B 6/12009* (2013.01); *G02B 6/29347* (2013.01)
USPC ............ 359/333; 385/3; 385/32; 250/227.12

(58) Field of Classification Search
USPC .......... 385/3, 24, 27, 32, 39, 50; 250/227.12; 359/333
See application file for complete search history.

(56) References Cited

U.S. PATENT DOCUMENTS

| | | | |
|---|---|---|---|
| 4,479,701 A | 10/1984 | Newton | |
| 4,696,063 A | 9/1987 | Schembri | |
| 6,289,151 B1 * | 9/2001 | Kazarinov et al. | 385/32 |
| 6,700,113 B1 | 3/2004 | Rhy et al. | |
| 7,035,495 B2 * | 4/2006 | Takahashi et al. | 385/15 |
| 7,167,649 B2 | 1/2007 | Song | |
| 7,593,647 B2 | 9/2009 | Lee | |
| 7,680,416 B2 | 3/2010 | Hann | |
| 7,916,767 B2 | 3/2011 | Sorin | |
| 8,488,922 B2 * | 7/2013 | Little et al. | 385/27 |
| 2006/0083515 A1 | 4/2006 | Hann | |
| 2008/0279557 A1 | 11/2008 | Park | |
| 2009/0074019 A1 | 3/2009 | Wong | |
| 2012/0093515 A1 | 4/2012 | Lin | |
| 2012/0269516 A1 | 10/2012 | Liu | |

FOREIGN PATENT DOCUMENTS

| | | |
|---|---|---|
| WO | 2012048665 | 4/2012 |
| WO | 2012140186 | 10/2012 |

* cited by examiner

*Primary Examiner* — Mark Hellner
(74) *Attorney, Agent, or Firm* — Shalini Venkatesh (57) ABSTRACT

Embodiments generally relate to an optical waveguide component configured for operation with amplitude modulated optical signals at a line rate. The optical waveguide component includes a first optical waveguide segment having a first port and a second port; and a plurality of second optical waveguides each forming a closed loop. Each of the second optical waveguides is electromagnetically coupled to the first optical waveguide exactly once, and each of the closed loops has a round trip time. A product of the line rate and each of the round-trip times is equal to or greater than unity.

11 Claims, 10 Drawing Sheets

MODULATION AVERAGING REFLECTORS

FIELD

The present invention relates to colorless passive-optical networks based on dense wavelength division multiplexing, and more particularly to extended-cavity light sources employing self-seeding and modulation averaging reflectors wherein said modulation averaging reflectors are implemented on planar-lightwave circuits and integrated with other optical components.

BACKGROUND

Access networks are presently experiencing rapid growth around the world. Both residential and business customers are demanding increasingly higher bandwidths from their Internet service providers who in turn are pressed to implement networks capable of delivering bandwidths in excess of 100 Mb/s per customer. For this application, passive-optical-networks (PON) are particularly well suited as they feature lowest capital-equipment expenditures relative to point-to-point and active optical networks. The book by C. F. Lam, *Passive Optical Networks: Principles and Practice*, Academic Press, 2007, and publication by C-H. Lee, W. V. Sorin, and B. Y. Kim, "Fiber to the Home Using a PON Infrastructure", *IEEE J. Lightw. Technol.*, vol. 24, no. 12, pp. 4568-4583, 2006 give good introduction into this technology. Wavelength division multiplexing in passive optical networks (WDM-PON) is one of the actively investigated as next-generation optical network architecture. WDM-PON provides higher bandwidth per user than any other network architecture and hence potentially offers the lowest cost per unit of bandwidth to the user. However, the key difficulty in such a system has been the cost of the components, particularly arising from the need to transmit light at one wavelength for a specific channel and also receive information at any one of several other wavelengths at the user end in the so-called optical network unit (ONU). WDM optical and optoelectronic components traditionally exhibit high cost, among other issues, due to precise wavelength definitions in such systems. A dramatic cost reduction is achieved by eliminating wavelength-specific transceivers at the ONU in the colorless WDM-PON system, also referred to as a system with wavelength-agnostic transceivers in the ONU.

In a colorless optical network, the wavelengths emitted and received by the transceiver in the ONU are defined in the remote node or the central office rather than in the transceiver at the ONU as is well known in the art—see book by Lam cited above. Further reduction in complexity and cost is realized by using a a self-seeding scheme as described in a publication by E. Wong, K. L. Lee, τ. B. Anderson, "Directly Modulated Self-Seeding Reflective Semiconductor Optical Amplifiers as Colorless Transmitters in Wavelength Division Multiplexed Passive Optical Networks", *IEEE J. Lightw. Technol.*, vol. 25, no. 1, pp. 67-74 (2007). However, due to insufficient seeding light power and modulation present in the seeding light there have been no commercial applications of this approach.

Therefore, an unmet need for a low-cost high-performance WDM-PON solution exists in the industry. This application discloses low-cost implementations of a modulation averaging reflector that enables performance enhancement of self-seeded colorless optical networks.

BRIEF DESCRIPTION OF THE FIGURES

FIG. 5(*a*): An illustration of one embodiment of a modulation averaging reflector FIG. 5(*b*): Schematic illustration of a two-port energy-coupling element.

FIG. 5(*c*): An illustration of one embodiment of a modulation-averaging transmitter.

FIG. 9(*a*): A schematic of a classic four-port optical coupler (PRIOR ART).

FIG. 9(*b*): A schematic illustrating an optical half-coupler.

SUMMARY

Figure 1:
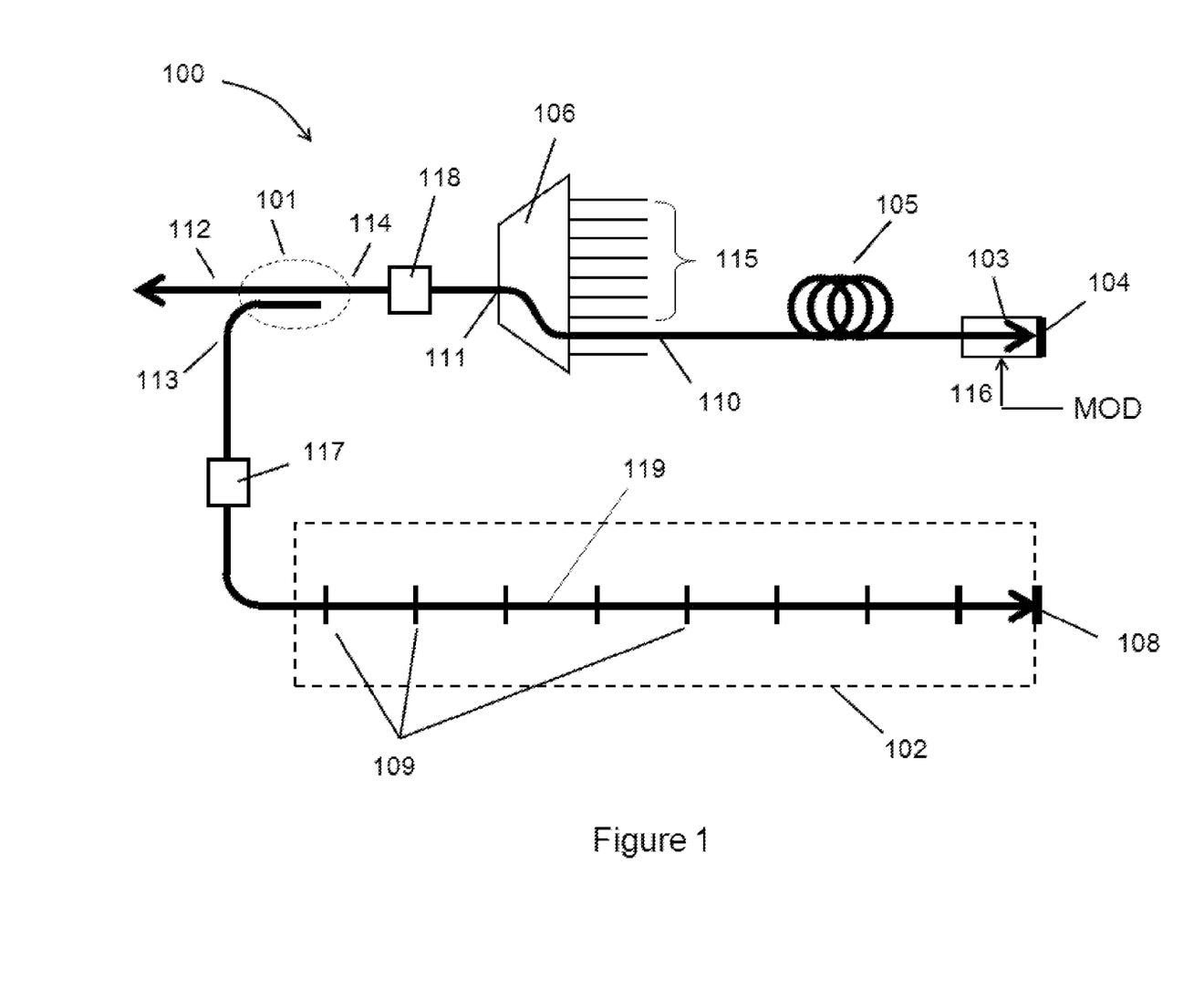
FIG. 1: Schematic illustrating an optical source employing a modulation-averaging reflector.

Certain features of a novel apparatus for improving the link margin of self-seeded colorless WDM-PON networks is described with the help of FIG. 1. FIG. 1 illustrates an exemplary block diagram of a self-seeded optical source 100 that employs a modulation averaging reflector 102. In one embodiment, an optical source 100 comprises a reflective semiconductor optical amplifier (RSOA) 103 terminated with a near-unity reflective mirror 104 on one end and a segment of a distribution fiber 105 on the other end of the RSOA 103, the distribution fiber 105 is also connected to a distribution port 110 on a filter 106, the common port 111 of the filter 106 is connected to an output coupler 101 via a first optional depolarizer 118, the output coupler 101 has at least one output port 112 and two working ports 113 and 114, wherein port 114 is coupled to the common port 111 via the optional depolarizer 118 and port 113 is connected to a modulation averaging reflector 102 via a second optional depolarizer 117. FIG. 1 illustrates one embodiment of the modulation averaging reflector 102 in which the reflector comprises a central waveguide 119 with energy coupling elements 109 arrayed at predefined distances along the central waveguide 119 and the central waveguide 119 is ultimately terminated with a high-reflectivity mirror 108. The energy coupling elements are two-port waveguide elements that couple electromagnetic energy in forward or reverse direction instantaneously or with a delay. Other embodiments of the modulation averaging reflector are disclosed below.

In one embodiment, the filter 106 is an array-waveguide grating (AWG) de-multiplexer in which one common port is optically coupled to a plurality of distribution ports 115 (M ports) each of which is tuned to a different wavelength. AWG multiplexers are commonly denoted by the product of the number of ports on each side of the grating. Hence, 1×M refers to 1 common port de-multiplexed into M distribution ports. In yet another embodiment, the filter 106 is an N×M array-waveguide grating multiplexer. In yet another embodiment, the filter 106 has only a single distribution port 110. The output from the light source 100 is emitted from port 112. The light is modulated at the RSOA 103 using direct electrical modulation as indicated with 116. Digital data is encoded into the optical signal by modulating the gain of the gain medium 103 (RSOA) using an electrical signal at the port indicated with the words "MOD" in 116. The electrical signal intensity modulates the output beam 112 (also referred to as Amplitude Shift Keying). For example, Gigabit Ethernet uses binary code with on/off keying, where the intensity of the output beam is modulated between two values per bit. Pulse amplitude modulation (PAM) can also be used. The modulation averaging reflector operates by averaging the intensity modulation in incident light.

Figure 2:
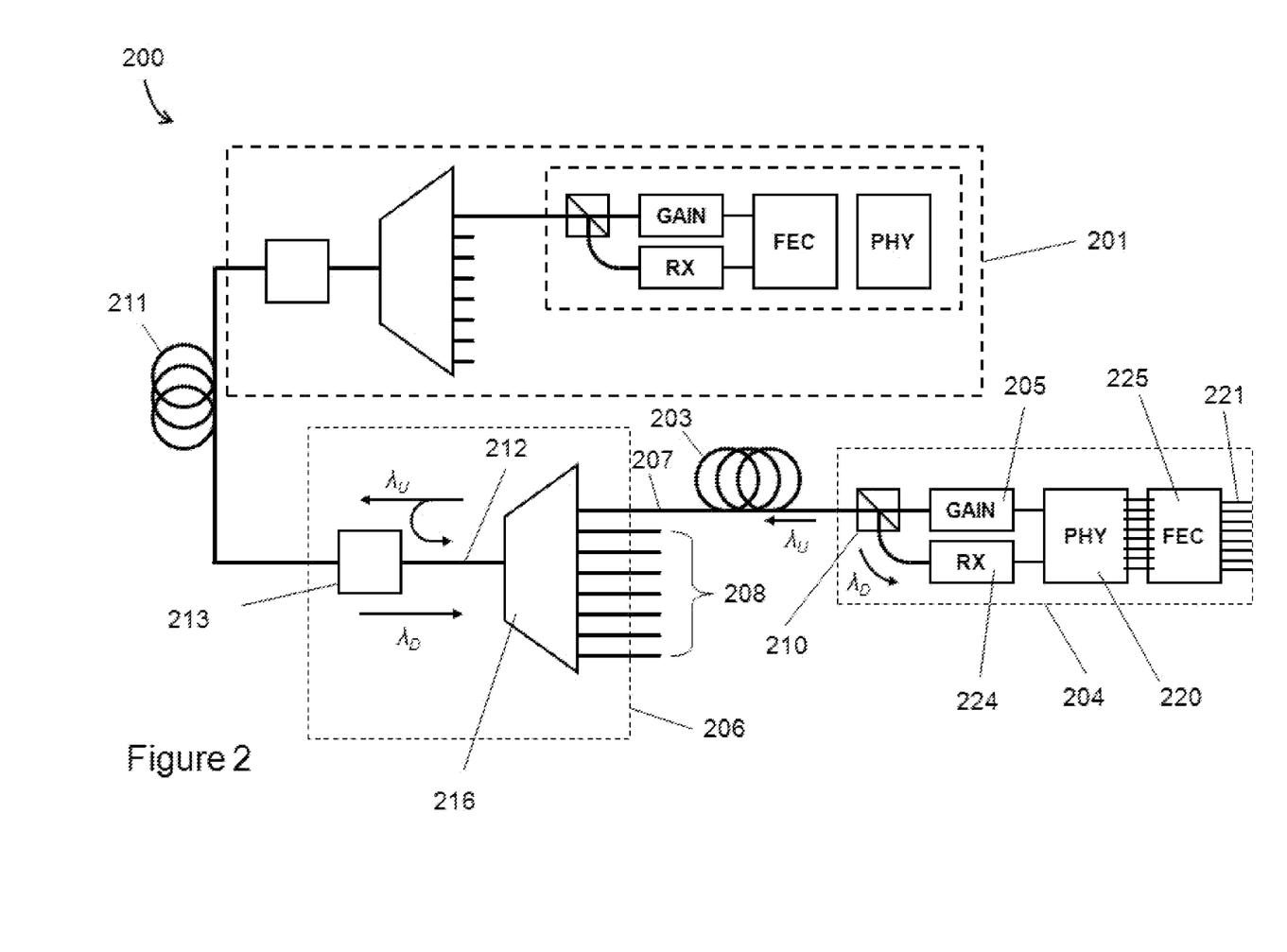
FIG. 2: Schematic illustrating an optical network link employing the optical source shown in FIG. 1.

FIG. 2 illustrates how the optical source of FIG. 1 fits into one embodiment of a passive-optical network system. In one embodiment, one link 200 of an optical system comprises of a central office 201, a trunk fiber 211, remote node 206, at least one distribution fiber 203 (only one shown), and optical network unit 204 (ONU). The trunk fiber 211 preferably carries multiple optical signals from the remote node 206 towards the central office 201 encoded in multiple wavelengths, commonly referred to as upstream wavelengths, denoted with $\lambda_U$, and upstream optical signals. The same trunk fiber 211 also preferably carries optical signals encoded in multiple wavelengths from the central office 201 towards the remote node 206. These wavelengths are referred to as downstream wavelengths, denoted with $\lambda_D$, and downstream optical signals. The ONU 204 comprises an optical-gain element 205, an optical receiver element 224, a beam-splitter 210 (also referred to as the "duplexer"), a physical-media interface (PHY) 220, a forward-error correction circuit 225, and connections to user electrical interface 221. The beam splitter separates the upstream optical signals from the downstream optical signals as indicated with the arrows next to the upstream and downstream wavelengths $\lambda_U$ and $\lambda_D$, respectively. Every individual ONU 204 of a multiplicity of ONUs 204 is optically coupled to a remote node 206 using the distribution fiber 203. Only one ONU 204 is shown, but each fiber 208 at the output of the remote unit 206 may have one ONU connected to it. The remote node 206 comprises a filter 216 which separates multiple downstream wavelengths encoded with data from the trunk fiber 211 into separate wavelengths on distribution fibers 207 and 208, and feeds those downstream optical signals to each individual ONU 204. The filter 216 simultaneously combines different upstream optical signals from the ONUs 204 via the distribution fibers 207 and 208 into one fiber 212. The remote unit 206 furthermore comprises a seeding element 213. The seeding element 213 reflects a portion of the upstream optical signal back towards the filter 216, the filter separates individual reflected upstream wavelengths and directs them to seed ONUs 204 associated with those wavelengths. The optical-gain element 205 amplifies and modulates the optical signal of associated wavelength appearing at its input and hence generates a new modulated upstream optical signal. In one embodiment, the principle of signal generation operative within the central office 201 is identical to the described principle of signal generation between the remote node 206 and the ONUs 204 at the end of each of the distribution fibers 207 and 208. Referring back to FIG. 1, the seeding element 213 comprises of an optical coupler 101 and a modulation-averaging reflector 102. In one embodiment, the seeding element further comprises a depolarizer in the output path, and yet in another embodiment, the seeding element comprises a depolarizer in the self-seeding path. The depolarization may also be accomplished using a Faraday rotator, and hence in an embodiment, the seeding element comprises a Faraday rotator in the output path, and in another embodiment, the seeding element comprises a Faraday rotator in the self-seeding path. The output from the optical source shown in FIG. 2 comprises a multiplicity of optical signals each at it own wavelength and modulation with different data stream. The bit rates of each of the optical signals do not have to be equal, but for maximum averaging effect they should be an integer multiple of the design baud rate.

The principle of light generation involves broadband spontaneous emission generated and intensity modulated by the optical-gain element 205 which is emitted towards the remote node 206 via the distribution fiber 203. The spontaneous emission is filtered in the filter 216 and only the selected wavelength $\lambda_U$ is passed through to the seeding element 213 via the optical interconnect 212. The seeding element reflects a portion of the incident light back towards the filter 216. A portion of the incident light is reflected and the reflected light exhibits substantially reduced optical modulation relative to the incident light, as the seeding element comprises modulation averaging reflector that reduces or removes substantially all modulation by a process of averaging. The reflected optical signal with the reduced modulation (averaged bit stream) is returned via the filter to the corresponding ONU 204, where it is amplified and modulated with a new data stream. A portion of the amplified and modulated light is transmitted through the seeding element 213 and delivered to the trunk fiber 211 for upstream communication.

FIG. 1 illustrates just the upstream path of the signal and hence the RSOA 103, distribution fiber 105, filter 106 and common port output 114 correspond to 205, 203, 216, and 212, respectively. The seedling element 213 comprises a coupler 101 and a modulation-averaging reflector 102 and optionally one or both of the depolarizers 117 and 118 or Faraday rotators. The essential fact is that the remote node 206 is passive and does not require any energy to perform its function. For this innovation to be commercially viable, one has to allow for a path to reducing the cost of the components. In the embodiment when the filter 106 is an array-waveguide grating (AWG) it is generally manufactured using planar lightwave circuit (PLC) technology and hence the optical coupler 101 and the modulation-averaging reflector 102 are integrated onto a planar lightwave circuit (and the depolarizers 117 and 118, if used). Four embodiments of the modulation-averaging mirror 102 are disclosed herein.

The purpose of the modulation-averaging reflector is to reduce (minimize) the intensity modulation in an incoming optical beam while reflecting substantially all of the power, i.e. keeping the reflection coefficient close to unity. The redistribution of the optical energy in time is equivalent to extreme inter-symbol interference. In one embodiment of the modulation-averaging reflector, multiple mirrors in the reflector are separated by $\tau/2$ where $\tau$ is the design time which is related to the design bit rate $B_\tau$ via $B_\tau\tau=1$. The coherence time of light is substantially shorter than the design time $\tau$, i.e. $\tau_{coh} <$ or $\tau_{coh} \ll \tau$. We define coherence time as the time interval for which the autocorrelation function $R(\tau)$ of the electric field reduces to ½ of its peak value. For optical signals with amplified spontaneous emission noise, the auto-correlation function is at a maximum at $\tau=0$ and decreases with $|\tau|$. Coherence length is defined as the product of coherence time and group-velocity of optical signal: $L_{coh}=v_g\tau_{coh}$. The Fourier transform of an optical-signal auto-correlation function $R(\tau)$ is the power-spectral-density (PSD) $\Omega(\omega)$, where $\omega$ is the optical wave oscillating frequency. The PSD $\Omega(\omega)$ decreases around the center oscillation frequency. It is common in the optics industry to express PSD and other spectra-related quantities in terms of wavelength rather than frequency, the conversion between the two being well known in the art. The linewidth of an optical signal is commonly expressed in terms of wavelength spread defined as the difference in wavelengths at which the PSD value reduces to ½ its value at the maximum; i.e. in terms of the full-width at half maximum (FWHM). Clearly, the relationship between the coherence time or length and the linewidth is deterministically defined via the Fourier transform between the auto-correlation and the power spectral density, as is well known in the art. In other words, knowing the power spectral density of an optical signal allows one to unambiguously determine the coherence time, coherence length, and the FWHM. Finally, this means that adding a signal to its own more-than-$\tau$ delayed version will show negligible interference. For this reason, the optical power (intensity) of the sum of the optical signals is equal to the sum of the optical powers (intensities) of the individual signals.

Averaging characteristics of the array reflector are at most weakly dependent on the distance between the reflectors if the mirror separation is increased by an integer multiple of $\tau/2$. The modulation-averaging reflector designed for line rate $B_\tau$ (design line rate) may be operated at a line rate B that is an integer multiple of the design line rate $B_\tau$ without any significant loss in modulation-averaging performance.

Figures 5A, 5B, 5C:
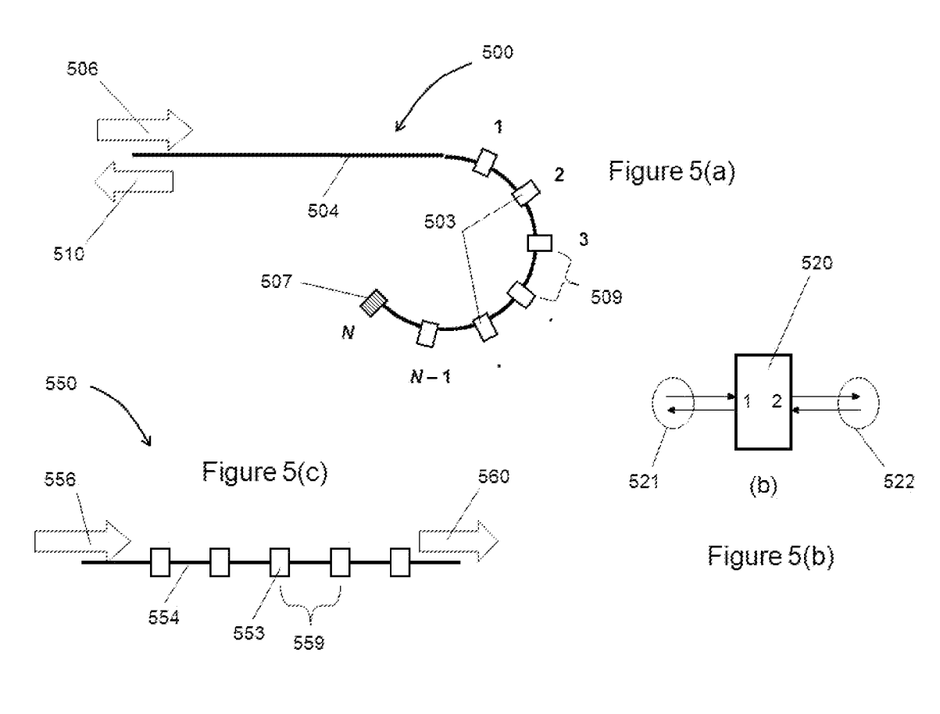

FIG. 5(a) shows an exemplary view of an embodiment where the modulation-averaging reflector 500 is realized with N energy-coupling elements 503 and 507. An energy coupling (EC) element is a two-port waveguide component that couples electromagnetic energy in forward or reverse direction instantaneously or with a delay, namely, they transmit and/or reflect energy instantaneously or have the capability to store energy and release this electromagnetic energy in reverse or forward direction at a later time. Instantaneous reflection/transmission means that the reflection/transmission delay is much shorter than the bit duration time or design time $\tau$. FIG. 5(b) illustrates an EC element 520 as a block that has two ports (1 and 2) which may be waveguides. Electromagnetic energy incident on port 1 is generally reflected back (as shown with 521) or is transmitted (522). The energy may be incident from port 2 and in that case will generally be reflected back (522) or transmitted to port 1 (521). The function of the EC elements is expressed with an intensity scattering matrix. This is similar to scattering matrix approach common to microwave and optics engineering, but the physical quantity scattered is optical power rather than electric/magnetic fields. The concept of an energy coupling element is used in this application solely for the purpose of encompassing passive memory-less mirrors and resonators which exhibit memory as one element. In the following embodiments, it will become clear that memory-less EC elements can be combined with ECs with memory without departing from the spirit of the invention. The energy coupling elements were introduced as two-port elements, but they may be single-port (one mirror, for example) or multiple port elements, such as, a 2×2 optical coupler. The waveguides and optical couplers are all single-mode optical components.

Continuing with the description of an embodiment illustrated with FIG. 5(a): An optical signal enters the fiber 504 in at the input port and in the direction shown by the arrow 506. The optical signal interacts with the EC elements 503 and 507. The shown EC elements are numbered the order in which an incident wave propagating along the central waveguide encounters them. Any one of the energy-coupling elements 503 and 507 may reflect a portion of the optical power towards the incident port instantaneously, but may also delay the reflection by a multiple of the design time $\tau$. Furthermore, any one of the energy-coupling elements may transmit a portion of the optical power instantaneously, but may also delay the transmission by a multiple of the design time $\tau$. The optical signals reflected, transmitted, and delayed on and by the EC elements all combine and add when they exit the modulation-averaging reflector at the input port in the direction denoted with 510. The "instantaneous" reflection or transmission mentioned above refers to EC elements whose reflection and transmission impulse responses have temporal rms-width a much smaller than the design time, namely, $\tau \gg \sigma$. Such EC elements are referred to as memoryless energy coupling elements. If on the other hand, the EC element includes a delay line or storage component in which the optical signal is delayed a time that is comparable to the design time $\tau$ or is repeatedly delayed with repetition time equal to the design time $\tau$, the reflection or transmission impulse response will clearly exhibit single or multiple impulses delayed by a time that is equal or close to the design time $\tau$. Such EC elements are referred to as energy-coupling elements with memory. For example, in later FIG. 6 an optical coupler 606 couples a fraction of the energy (traveling in the forward direction 604) from the central waveguide 601 into a ring delay line 603, and later that energy is coupled in the same direction along the central waveguide 601. The optical coupler 606 and the ring delay line 603 form an energy coupling element with memory. The transmission though this EC element exhibits multiple signals each of which is delayed by the round-trip 608 of the ring delay line 603. The round trip 608 is at least $\tau$ long, which makes the signal transmitted though one EC element on the central waveguide have multiple peaks each separated by $\tau$. The optical performance of any EC element can be described using reflection and transmission impulse responses $h_R(t)$ and $h_T(t)$, where the impulse response refers to optical power. By this definition, the entire modulation-averaging reflector is a single-port EC element with memory. Energy-coupling elements may have four ports as is shown in the embodiment D below.

Modulation averaging reflector works when the optical signal is intensity modulated with digital information, such as, on/off keying or pulse-amplitude modulation, with modulation (bit) rate B. The intensity modulation is characterized by (i) the symbol state duration, (ii) the number of intensity levels into which information is encoded, (iii) the frequency content and the maximum runlength of the modulated optical signal. The number of symbol changes per second in a signal is referred to as symbol rate. Symbol rate is also referred to as baud rate or modulation rate in digitally modulated signals and is measured in baud (Bd) or symbols/second. The symbol rate is related to, but should not be confused with, bitrate which is the number of bits transmitted per second, because each symbol can represent several bits of data if multiple-level pulse-amplitude modulation is used, or less for some coding schemes. In a simple binary or on/off keyed digital signal commonly used in, for example, Gigabit Ethernet, the symbol state duration is equal to the bit duration, the number of intensity levels is two (PAM-2), while the frequency content is that of a 8B10B coding algorithm (maximum runlength equals five). In PAM-4 modulation scheme, the number of intensity levels is four, while the symbol state duration is one bit. The modulation averaging reflector is useful for averaging the modulation in any of the mentioned modulation schemes. The design parameter for any modulation averaging reflector is the "design time" denoted with $\tau$. The design time is equal to the symbol state duration, i.e., inverse of the symbol rate of the communication protocol that is intended to be used with the averaging reflector. The design time $\tau$ also defines the design symbol rate $B_\tau$ as $B_\tau=1/\tau$. Within the reflector, portions of this modulated optical signal are repeatedly delayed by an integer number of symbol durations and finally summed before exiting the modulation-averaging reflector. Modulation averaging reflectors are also effective when the communication symbol rate B is different from the design rate $B_\tau$. Clearly, the averaging properties of the modulation-averaging reflector persist largely unchanged when $B=n·B_\tau$, where n is an integer. Furthermore, even for n real positive numbers, the modulation averaging reflector averages the modulation though multiple reflections.

In one embodiment, the time delay between the EC elements 509 is an integer multiple of the design time mT/2, where m is an integer. In another embodiment, the round trip time between two adjacent EC elements depends on the ordinal number of the EC elements counted from mirror 503. In this latter embodiment, the time delay between adjacent EC elements are adjusted to produce an array reflector with best modulation reduction at a given bit rate range for the lowest number and simplest type of EC elements. In one embodiment, the individual EC elements are memory-less mirrors embedded into the central waveguide and the peak reflectivity of all mirrors is equal for all gratings mirrors except the last one 507. In yet another embodiment, the EC elements 503 are mirrors with reflectivities that monotonically increase with the ordinal number of the mirror starting from the first mirror 503 and ending with the last mirror 507 which has highest reflectivity. In one another embodiment, the EC elements are fiber Bragg gratings (FBG). A fiber Bragg grating is a type of distributed Bragg reflector constructed in a short segment of optical fiber within which a periodic variation in the refractive index of the fiber core creates a wavelength-dependent reflection of the light propagating through the fiber that reflects particular wavelengths of light and transmits all others. Such FBG structures are commercially available from a multiplicity of vendors and can be made with varying reflectivities and spectral bandwidths as is well known in the art. In one embodiment, the spectral width, or the full-width of half-maximum of the reflection spectra of the FBG used to construct the modulation averaging reflector is sufficient to encompass all the wavelengths of interest in the operation of the network.

The innovative concepts employed in building and designing modulation averaging reflectors (MAR) can be used to build a modulation averaging transmitter (MAT). It is clear from FIG. 5(a) that a modulation averaging reflector, which is a single-port optical component, comprises a central waveguide 504 with a plurality of energy coupling elements 503 disposed along the central waveguide, and that the central waveguide 504 is terminated with a high-reflectivity mirror 507. Similarly, a modulation averaging transmitter 550, which is a two-port optical component as shown in FIG. 5(c), can be built using a central waveguide 554 with a plurality of energy coupling elements 553 disposed along the central waveguide 554, while instead of the high-reflectivity mirror there is a port though which light exits in the direction 560. As in the case of the reflector 500, the separation between the energy coupling elements 559 is maintained constant and proportional to the design time $\tau$. The modulation averaging transmitter transmits bit-averaged signal that was incident on the input port in direction 556. It is clear that every modulation averaging reflector can be converted into a modulation averaging transmitter by simply removing the high-reflectivity mirror at the end of the modulation averaging reflector and using that end of the central waveguide as a second port. This applies to all the embodiments further disclosed in this application: all of the inventive concepts applied to a modulation reflector apply to modulation averaging transmitter so built.

Further implementation of the self-seeded light source and the modulation averaging reflector shown in FIG. 1 is presented in a series of embodiments each of which have their own advantages. The selection of which of the embodiments shall be implemented in a practical design will depend on the application and the specific requirements of the user.

Figure 3:
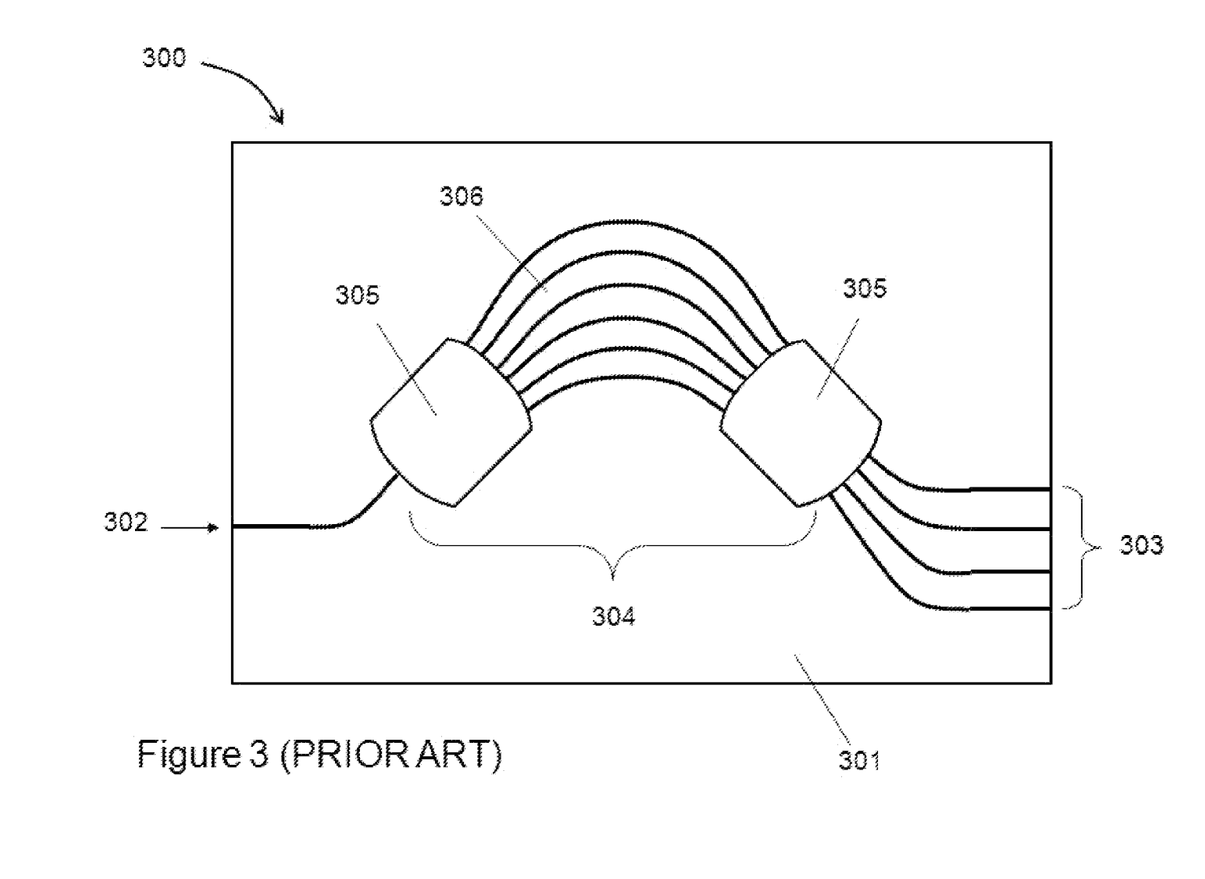
FIG. 3: (PRIOR ART) An exemplary view of an array-waveguide grating.

FIG. 3 illustrates a typical array-waveguide grating (AWG) chip 300 as it is made today (PRIOR ART). This passive component is ubiquitous in optical networking and is used for filtering, separating, combining, and routing signals of different wavelengths as is well known in the art. Its use and principle of operation is described in publicly available texts, such as, "WDM Technologies: Passive Optical Components" by A. K. Dutta, N. K. Dutta, and M. Fujiwara, published by Academic Press in 2003. The AWG 300 is most commonly implemented using planar lightwave circuit technology as is indicated with the chip 301. Planar lightwave circuit technology (PLC) is described in many publicly available texts such as "Planar Circuits for Microwaves and Lightwaves" by Takanori Okoshi, published by Springer Verlag 1985 and in "Frontiers in Planar Lightwave Circuit Technology: Design, Simulation, and Fabrication" published by NATO Science Series, 2006. A typical AWG 300 comprises of a array grating 304 disposed on a chip 301. The array grating 304 comprises two mixing areas 305 and waveguides 306 of different lengths which provide for the phase difference between different components that interfere in the mixing areas 305 to separate a signal entering at the common port 302 into distribution ports 303 each with different wavelength. The component is reciprocal in that signals of different wavelength entering at the distribution ports 303 can be combined into one common port 302. The optical source shown in FIG. 1 may use this type of an AWG as filter 106. The physical properties of the dielectrics used in building the AWG shown in FIG. 3 are temperature dependent and consequently this temperature sensitivity results in a shift of the filter wavelengths. It is well known in the art today that this temperature variation can be efficiently compensated by using so-called athermal array-waveguide gratings. This technology is described in publicly available texts such as "Recent Progress on Athermal AWG Wavelength Multiplexer" by Shin Kamei published at the Optical Fiber Communications conference in San Diego, Calif. in 2009.

DETAILED DESCRIPTION

The realization of the modulation averaging reflector in planar-lightwave circuit technology requires the creation of (i) waveguide segments of specific length larger than the coherence length of the light to be propagated though the reflector, (ii) plurality of EC elements that either reflect the optical power or couple the optical power out of or into the waveguide segments, and (iii) one high reflectivity mirror so that (iv) the time intervals between the reflections at the transmitting mirrors and the high-reflectivity mirror are fixed and determined by design. At least elements (i), (ii), and (iii) must be integrated on the same PLC chip. The time intervals may be all equal to form a uniform array reflector, or may be progressively changed. The interval between the reflections or coupling in/out of the waveguide has to be related to the design time $\tau$ in order to realize optical-signal averaging. For example, for 10 Gbps line rate, the design time is 100 ps. Therefore, the distance between the transmitting mirrors (or couplers) has to be $v_g\tau$, where $v_g$ is the group velocity of light in the waveguide. If we assume that $v_g \approx 2 \cdot 10^{10}$ cm/s, we have that the separation between the mirrors or couplers has to be around 1 cm. The following are embodiments that utilize PLC technology to realize modulation-averaging reflectors.

Figure 9A:
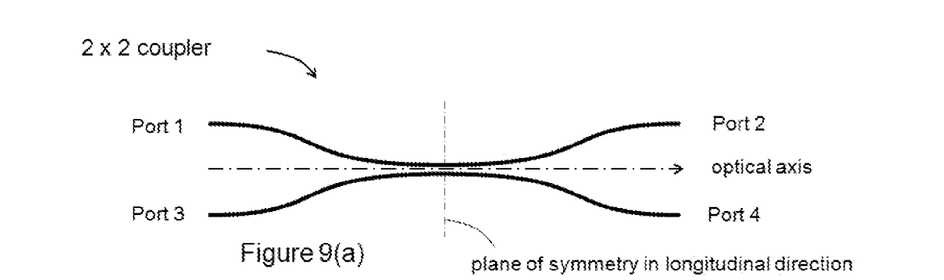

For the purposes of this disclosure, a four-port optical coupler used in the embodiments described below is also referred to as a 2×2 optical coupler. This type of coupler is ubiquitous in the optics industry. It comprises two waveguides or optical fibers that are brought in proximity over some length of the waveguide referred to as the coupling or mixing section. In the coupling section, the electro-magnetic fields of the two waveguides overlap causing the energy from one waveguide to transition into the other waveguide and vice versa thereby realizing the coupling of energy from one waveguide to another. The coupling between the energy is quantified by a coupling coefficient κ which also depends on wavelength of light propagating through the coupler. The 2×2 waveguide coupler features four ports. One port numbering convention is illustrated in FIG. 9(a) where the port 1 and 3 refer to first end of the two waveguides mentioned above and ports 2 and 4 to the second end of the two waveguides mentioned above, respectively. When optical signal is incident from port 1, the coupling coefficient κ quantifies the fraction of the power incident on port 1 that is coupled to port 4, while the energy reaching port 2 is then proportional to 1−κ, reduced only by the coupler losses. The energy returning to port 3 is generally small. As illustrated in the above example, this convention has the useful feature that, even-numbered ports couple energy to odd-numbered ports and vice versa. The coupling of even-numbered ports to even-numbered ports (and also odd-to-odd) is negligible in low-loss couplers, i.e., well designed and manufactured optical couplers. In a very low loss coupler, almost of all the energy incident to one port is emitted out of the ports with opposite polarity. This disclosure relies on this even/odd numbering of optical coupler ports. Owing to reciprocity, the same coupling coefficient leads to ratio of transmitted powers into all ports when the energy is incident at other ports, as is well known in the art. Referring back to FIG. 9(a), when energy is incident from, for example, port 4 and the coupling coefficient is small, most of energy is transmitted to port 2. Port 2 is hence often referred to as the "direct port" and port 1 as the "coupled port". These denominations help to associate functions to the ports.

Embodiment A

Modulation Averaging Reflector with Half-Coupler Mirrors

Figure 8:
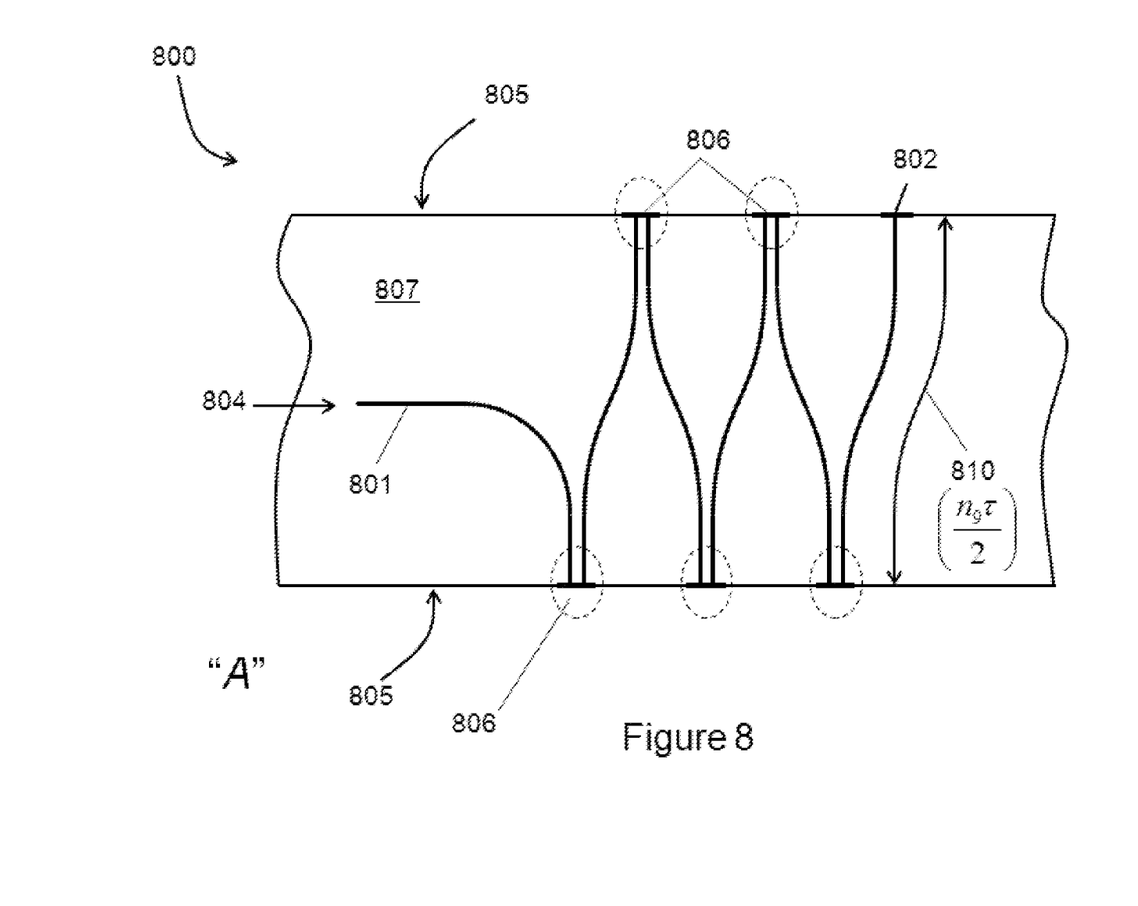
FIG. 8: Exemplary illustration of embodiment A of a modulation averaging reflector with optical half-couplers disposed on a planar-lightwave circuit chip.
Figure 9B:
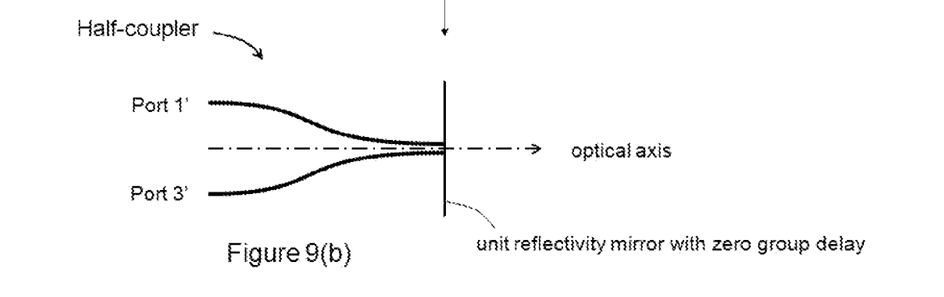

An embodiment (embodiment A) is illustrated with the help of FIG. 8 where a PLC-based modulation averaging reflector 800 disposed on a PLC chip 807 comprises of a central waveguide 801 which features a plurality of optical half-couplers 806 and is terminated with a high-reflectivity mirror 802. We define a half-coupler as a four-port optical coupler that is (i) cut along a plane perpendicular to the optical axis of the coupler at (or approximately at) the center of the coupler mixing section (realizing two near-identical parts) and (ii) coating the cut plane with ideally unity-reflectivity mirror with zero group delay as is illustrated in FIG. 9. FIG. 9(a) illustrates the form of a standard two-port coupler with the optical axis and the transverse symmetry plane. An ideal half-coupler, shown in FIG. 9(b), is realized by replacing one half of the four-port optical coupler with a unit-reflectivity mirror with no group delay. In practice, the unit-reflectivity mirror is built with a high reflectivity interference coating with low group delay realized by using high-refractive index ratio in a quarter-wave stack. In one embodiment, the modulation averaging reflector is realized using half-couplers as energy coupling elements.

Referring back to FIG. 8, the central waveguide 801 has an input end operatively configured to accept optical signal denoted with arrow 804 and a reflective end terminated with high reflectivity mirror 802. The reflective end 802 and half-coupler terminations 806 are realized by depositing an interference coating on the PLC chip edges 805. The time delay 810 between adjacent half-couplers 806 indicated with $n_9\tau/2$ in FIG. 8 is related to the design symbol rate via $B_\tau\tau=1$. In one embodiment, the multipliers $n_i$ are integers. In another embodiment, the multipliers $n_i$ are all equal. In yet another embodiment, the multipliers $n_i$ are all different real numbers designed to chirp the modulation-averaging reflector in order efficiently average the symbol streams with symbol rates B different from the design bit rate $B_\tau$. Inasmuch as cost of the PLC chip depends on the area, it is preferred that the n-factors are all as small as possible. So, if uniform modulation-averaging reflector is to be made, then $n_i=1$ give smallest modulation averaging reflector. The half-coupler is a memory-less energy coupling element with intensity transmission and reflection coefficients equal to $\kappa_A$ and $1-\kappa_A$, respectively. Here $\kappa_A$ is the full 2×2 optical coupler coupling coefficient (example shown in FIG. 9(a)).

In an embodiment, an optical waveguide component ("half-coupler") comprises (i) an input optical waveguide and an output optical waveguide; (ii) a coupling section extending over at least a portion of said input optical waveguide and said output optical waveguide and over which said waveguides are proximal to form an optical coupler, said coupling section having an optical axis; (iv) wherein said coupling section is terminated with a high-reflectivity mirror perpendicular to said optical axis. In another embodiment, said high-reflectivity is a metal mirror, and yet in another embodiment, said high-reflectivity is an optical interference coating.

In another embodiment, a waveguide structure comprises (i) a plurality of two-port optical waveguide reflectors connected using a plurality of waveguide segments; wherein (ii) each of said two-port optical waveguide reflectors comprises a two-waveguide coupling section having an optical axis, said coupling section terminated with a high-reflectivity mirror perpendicular to said optical axis. In another embodiment, said waveguide structure has at least one waveguide segment of said plurality of waveguide segments terminated with a high-reflectivity mirror. In yet another embodiment, this waveguide structure is furthermore configured for use with an intensity-modulated optical signal having a central wavelength and a symbol rate, and each waveguide segment of said waveguide segments exhibits an optical propagation delay at said wavelength, wherein a product of each of said optical propagation delays and said symbol rate is substantially equal to an integer divided by two. In another embodiment, said waveguide structure is further described with said waveguide segments are disposed on a planar-lightwave circuit chip.

Embodiment B

Modulation Averaging Reflector with Linear Delay Lines

Figure 7:
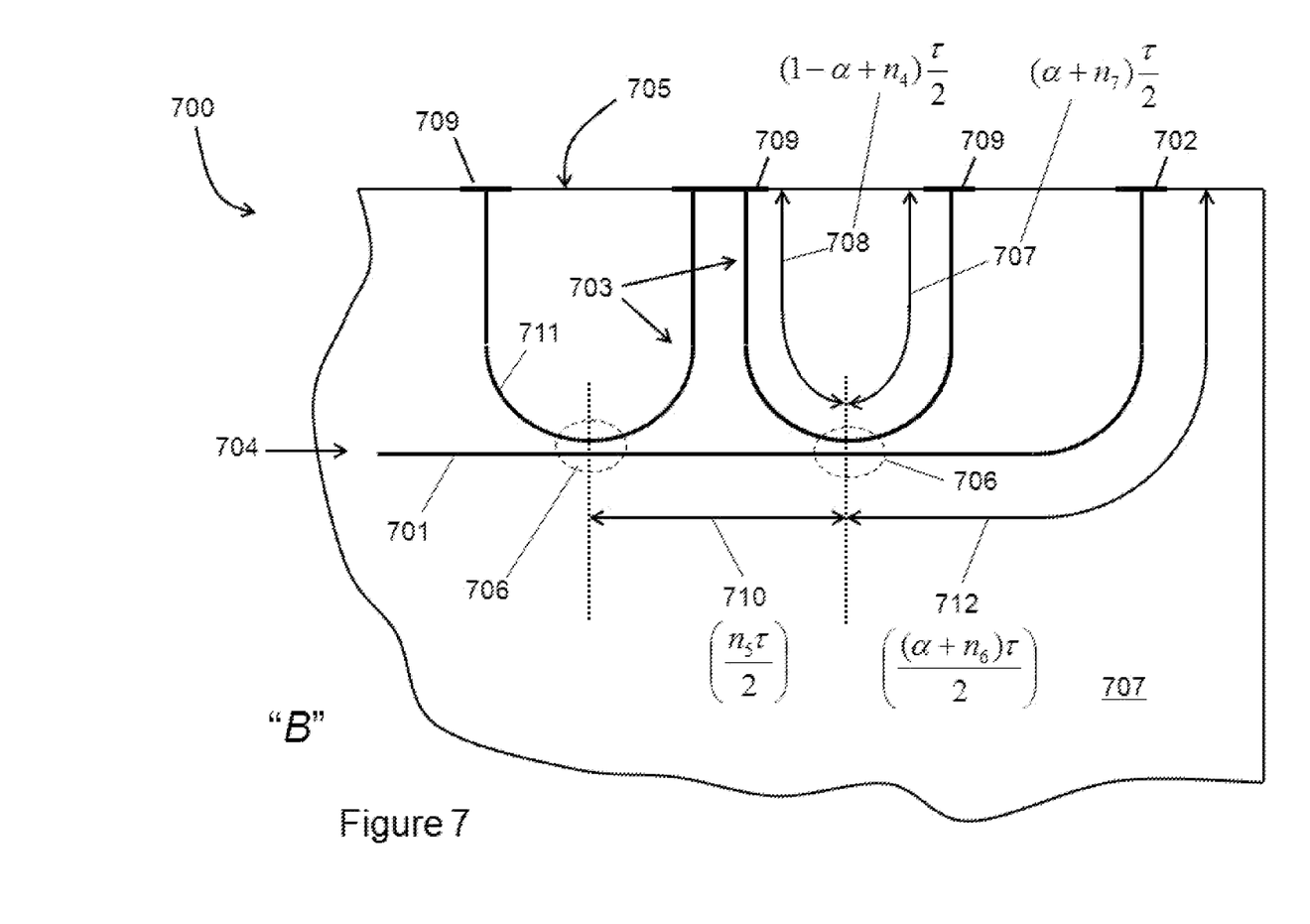
FIG. 7: Exemplary illustration of embodiment B of a modulation averaging reflector with linear delay lines disposed on a planar-lightwave circuit chip.

FIG. 7 illustrates an example of another embodiment (Embodiment B) of a PLC-based modulation-averaging reflector 700 disposed on a PLC chip 707. The modulation averaging reflector 700 comprises of a central waveguide 701 having an input end configured to accept optical signal denoted with the arrow 704 and a reflecting end terminated with a high-reflectivity mirror 702. Along the central waveguide at specific locations, linear delay lines 703 in form of U-resonators are coupled to the central waveguide 701 using optical couplers 706. Each of the linear delay lines comprises of a segment of a waveguide 711 terminated with a high-reflectivity mirror 709 one each end and an optical coupler 706 located at a suitable location in the waveguide segment 711. Linear delay lines have the form of Fabry-Pérot resonators: a waveguide cavity clad with two mirrors at each end, but in these linear delay lines, the round trip propagation time is longer than the coherence time of the propagating light beam and hence field-based interference between the circulating wave is negligible; the phase is randomized by the time the beam makes its way around the cavity. Instead, the optical power of the circulating light beam sampled at time intervals equal to the round-trip time of the linear delay line and the optical power that results from the sum accumulates which results in averaging. The averaging occurs when the signal is sampled at a time instances that are an integer multiple of the symbol-state duration and the symbol values are random. The round trip time of the linear delay line is the time that it takes an optical signal to make one full trip around the U-resonator: twice across the cavity and reflected upon each mirror once. The round trip time depends on the wavelength and the propagation constant of the waveguide. The coupling coefficient $\kappa_B$ for optical power from the central waveguide 701 into the linear delay line 703 determines the transmission and reflection of each junction between the central waveguide and the linear delay line 703. The optical-power reflectivity of the high-reflectivity mirrors 709 is close to unity ($r_B \approx 1$). The time delay 707 between the location of the coupler 706 and the high-reflectivity mirror 709 in the direction of the incident optical signal 704 is denoted $(\alpha+n_7)\tau/2$, while the time delay 708 to the other high-reflectivity mirror is denoted with $(1-\alpha+n_4)\tau/2$ as shown in FIG. 7. The parameters $n_4$ and $n_7$ are integers and hence the round trip time 707+708 in the linear delay line is an integer multiple of the design time $\tau$. The time delay 710 between adjacent linear delay line couplers 706 is an integer multiple of $\tau/2$ as shown in FIG. 7 with $n_5\tau/2$, where $n_5$ is an integer. The time delay 712 between the coupler 706 of the last linear delay line and the high-reflectivity mirror 702 has is $(\alpha+n_6)\tau/2$, where in one embodiment, $n_6$ is an integer. The multipliers $n_4$, $n_5$, $n_6$, and $n_7$ are exemplary integers and my or may not be equal to each other. In one embodiment, the multipliers $n_i$ are all equal. In yet another embodiment, the multipliers $n_i$ are all real numbers designed to chirp the modulation-averaging reflector in order to efficiently average the bit streams with bit rates other than the design bit rate $B_\tau$. The factor $\alpha$ can be a real number between zero and unity and the simplest structure is realized when $\alpha=\frac{1}{2}$. Inasmuch as cost of the PLC chip depends on the area, it is preferred that the n-factors are all as small as possible. In one embodiment, the high-reflectivity mirrors 702 and 709 are realized by depositing an interference coating on the PLC chip edge 705. The advantage of the embodiment shown in FIG. 7 is that all the high-reflectivity mirrors can be fabricated on the same PLC chip edge 705 and at the same time. The couplers 706 do not necessarily have to be located at the center of the linear delay line 703, however it is necessary that the round trip times between all possible reflections on the mirrors 709 and the coupling into the central waveguide 701 at the couplers 706 always produces a controlled near-integer multiple of the design round trip time $\tau$. This is ensured with the rules given for 710, 712, 707, and 708 above. Deviating from the $n_4$, $n_5$, $n_6$, and $n_7$ recommendations does not depart from the spirit of the invention.

The linear delay lines accept an optical signal (via coupling from the central waveguide) and periodically deliver amplitude-reduced copies of this optical signal back to the central waveguide (via coupling). The periodic delay occurs because the coupled signal travels back and forth within the linear delay line and reaches the coupler every $n_j\tau$ to let some of the optical power back into the central waveguide (via coupling). Ideally, all or near-all of the energy coupled into the U-resonator delay line comes back to the central waveguide. This periodic and delayed return of the portions of the optical signal that was incident into the modulation-averaging reflector is essential in averaging the symbols of the incident signal. The linear delay line is a two-port energy coupling element with memory.

In one embodiment, a waveguide structure comprises (i) at least one four-port optical coupler having an input port and three working ports; (ii) one waveguide segment connected to each of said three working ports; (iii) wherein said three waveguide segments are each terminated with a high-reflectivity mirror. In another embodiment, said waveguide structure is furthermore configured for use with an intensity-modulated optical signal having a central wavelength and a symbol rate, and each of said three waveguide segments exhibits an optical propagation delay at said wavelength, wherein a product of each of said optical propagation delays and said symbol rate is substantially equal to an integer divided by two. In yet another embodiment, in said waveguide structure furthermore said four-port optical coupler and said waveguide segments are disposed on a planar lightwave circuit chip.

Embodiment C

Modulation Averaging Reflector with Ring Delay Lines

In one embodiment (embodiment C), a modulation-averaging reflector is realized using a segment of waveguide disposed in a PLC chip, referred to as the central waveguide, to which at suitable locations ring delay lines are located and to which a fraction of the optical power propagating along the central waveguide is coupled to be returned periodically with a period z by the ring delay line into the central waveguide in the same direction as the incident light. A ring delay line can also be referred to as a closed-loop waveguide or a looped waveguide. One embodiment is illustrated with FIG. 6. A modulation-averaging reflector 600 disposed on a PLC chip comprises of a central waveguide 601 that extends on the surface of the PLC chip 607. The input end of the central waveguide 601 is operatively configured to accept an optical signal (indicated with the arrow 604), while the other end is terminated with a high-reflectivity mirror 602. Along the central waveguide at specific locations, ring delay lines 603 are coupled to the central waveguide 601 using optical couplers 606. Ring delay lines have the form of ring-resonators, but in these ring delay lines, the round trip propagation time is longer than the coherence time of the propagating light beam and hence field-based interference between the circulating waves is negligible; the phase is randomized by the time the beam makes its path around the perimeter. At the exit of the modulation-averaging reflector, the optical power of the circulating light beam sampled at time intervals equal to the round-trip time of the ring-delay line accumulates and thereby realizes signal averaging. The averaging occurs when the signal is sampled at a time instances that are an integer multiple of the symbol state duration and the symbol values are random or pseudo-random. The round trip time of the ring delay line is the time that it takes an optical signal to make one full trip around the ring delay line. It depends on the wavelength and the propagation constant of the waveguide. The coupling coefficient $\kappa_C$ for optical power from the central waveguide 601 into the ring delay lines 603 determines the transmission of each junction between the central waveguide and the ring delay line 603. The round trip time 608 within any one of the ring delay lines $n_j\tau$ are all integer multiples of the design time $\tau$. In one embodiment, the multipliers $n_1$, $n_2$, and $n_3$ are all equal. In yet another embodiment, the multipliers $n_1$, $n_2$, and $n_3$ are all real numbers designed to chirp the modulation-averaging reflector in order to efficiently average the bit streams at a variety of symbol rates B other than the design symbol rate $B_\tau$. To first order, the time delay 610 between different ring delay lines 603 and the time delay 611 between the last ring delay line and 703 and the high-reflectivity mirror 602 at the end of the central waveguide do not enter the design. The reason for this is because the ring delay lines may be designed not to exhibit significant reflection, but only delayed transmission of energy. In this way, the overall size of the averaging structure can be reduced since the separations 610 and 610 do not have to be related to the design time. Inasmuch as cost of the PLC chip depends on the area, it is preferred that the n-factors are all as small as possible and that the distances between adjacent optical couplers (energy coupling elements) is as small as possible. In one embodiment, the high-reflectivity mirror 602 is realized by depositing an interference coating on the PLC chip edge 605. In one embodiment, the high-reflectivity mirror 602 is omitted and port where the mirror 602 was is used as an output port thereby creating a modulation-averaging transmitter.

Figure 6:
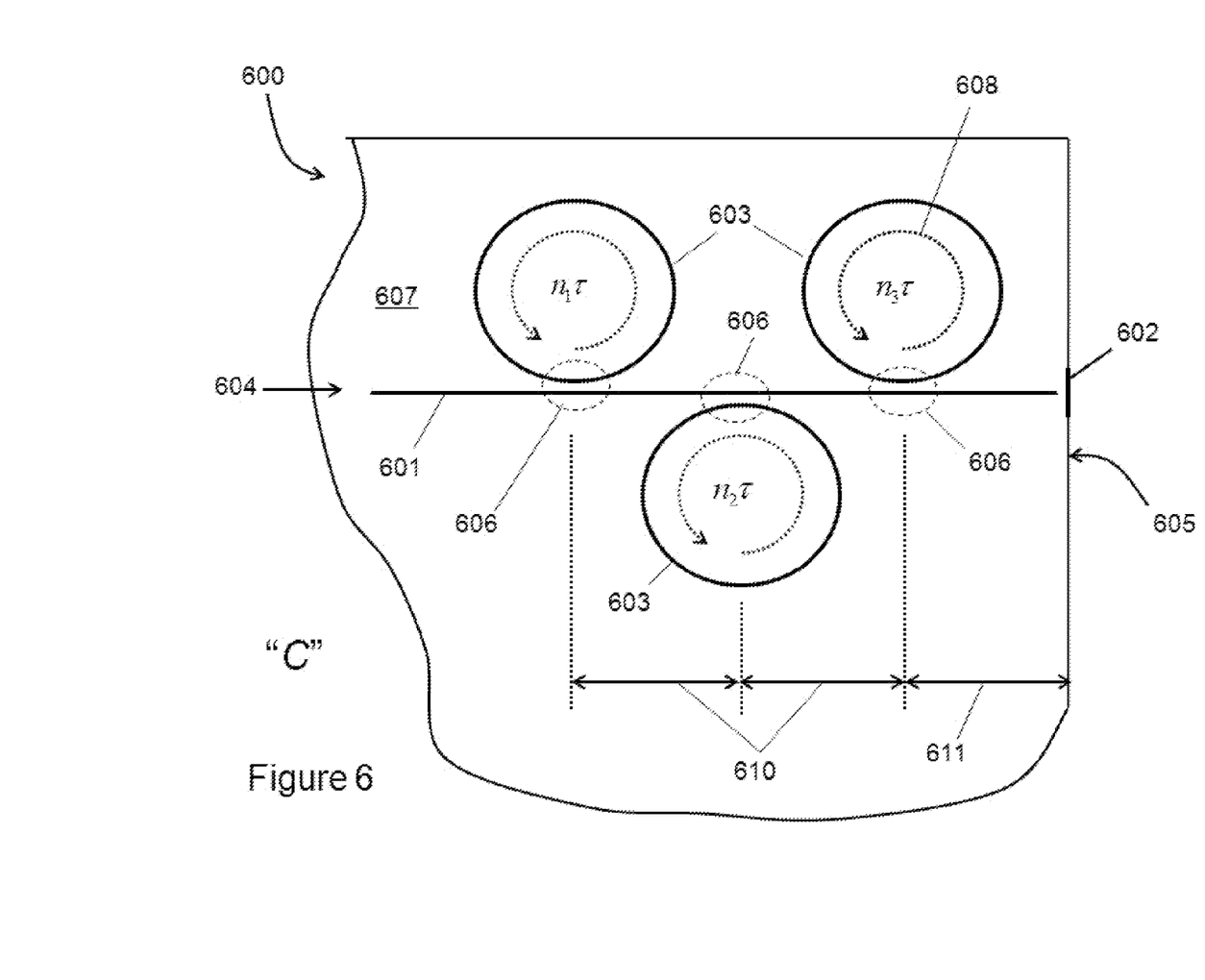
FIG. 6: Exemplary illustration of embodiment C of a modulation averaging reflector with ring delay lines disposed on a planar-lightwave circuit chip.

The ring delay lines accept an optical signal (via coupling from the central waveguide) and periodically deliver amplitude-reduced copies of this optical signal back to the central waveguide (via coupling) in the same direction as light was coupled into the delay line. The periodic delay occurs because the coupled signal travels along the perimeter of the ring delay line and reaches the coupler every $n_j\tau$ to let some of the optical power back into the central waveguide (via coupling). Note that as the optical signal reflects from the high-reflectivity mirror 602 at the end of the central waveguide 601, and starts propagating towards the input port (to exit) the ring delay lines 603 operate in the same way: The power coupled into the ring delay lines 603 is periodically returned in the direction towards the input port. Ideally, all or near-all of the energy coupled into the ring delay line comes back to the central waveguide. This periodic and delayed return of the portions of the optical signal that was incident into the modulation-averaging reflector is essential in averaging the bits of the incident signal.

In one embodiment, a waveguide structure comprises (i) at least one four-port optical coupler, said four ports numbered with integers so that optical signals are coupled between ports of different parity; (ii) a waveguide input port optically coupled to one of said four ports; (iii) a first waveguide segment terminated with high-reflectivity mirror connected to another port of said four ports; (iv) at least one second waveguide segment; (v) wherein said at least one second waveguide segment is connected to two of said four ports with different parity. In another embodiment, said waveguide structure is further characterized as being configured for use with intensity modulated optical signal having a central wavelength and a symbol rate, and said second waveguide segment having optical-signal propagation delay, wherein a product of said optical-signal propagation delay and said symbol rate is substantially equal to an integer. In another embodiment, in said waveguide structure said first waveguide segment, said at least one second waveguide segment, and said at least one four-port optical coupler are disposed on a planar-lightwave circuit chip.

Embodiment D

Self-Coupling Modulation Averaging Reflector

Figure 10:
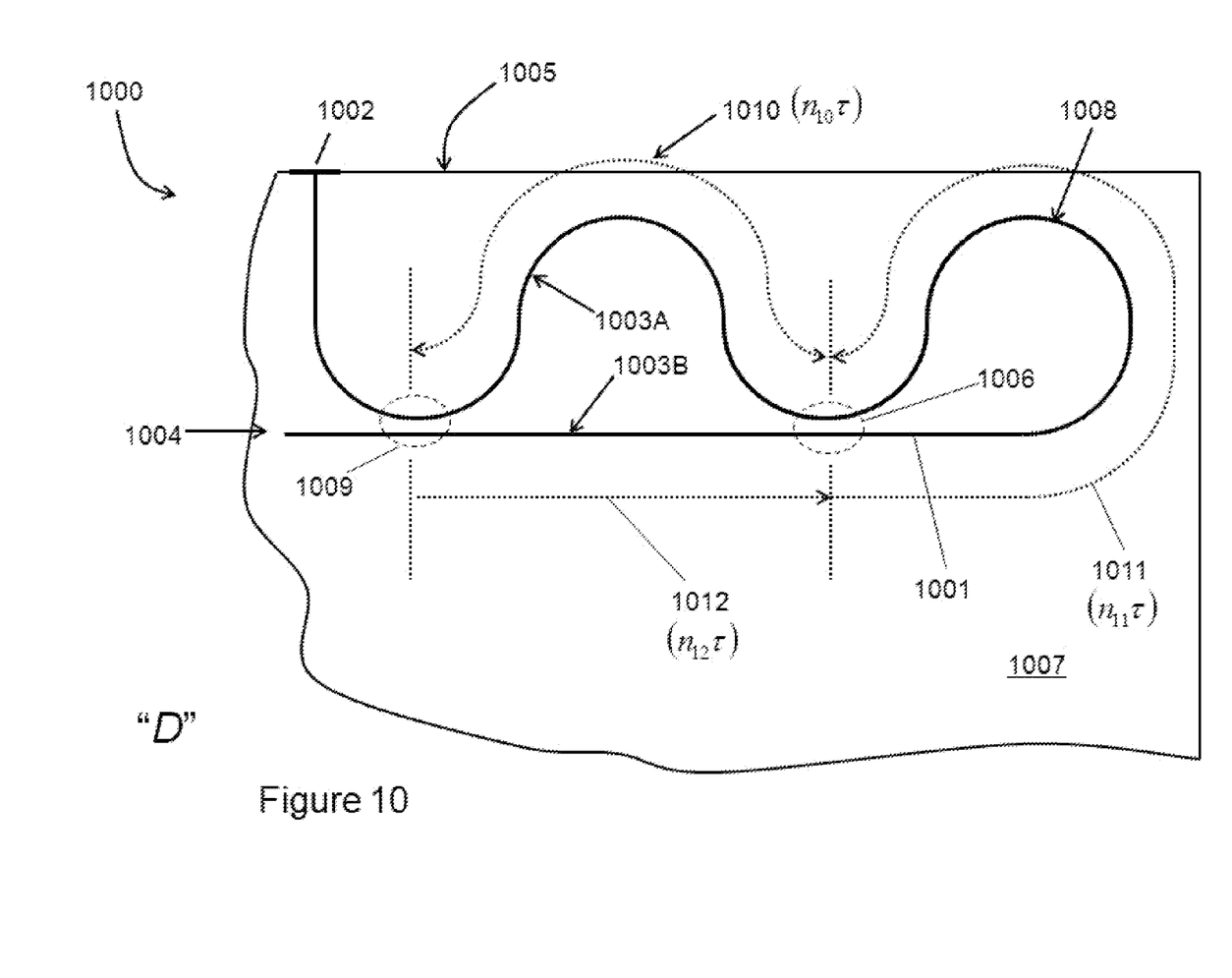
FIG. 10: Exemplary illustration of embodiment D of a self-coupled modulation averaging reflector disposed on a planar-lightwave circuit chip.

Another embodiment (Embodiment D) is illustrated with the help of FIG. 10 where modulation-averaging reflector 1000 disposed on a planar-lightwave circuit chip 1007 comprises of a single central waveguide 1001 which is coupled into itself at multiple locations forming at least one loop waveguide 1008 using an optical coupler 1006 and optionally any number of differential waveguide sections denoted with 1003A/B. Perimeter propagation time around the at last one loop waveguide 1008 is denoted with 1011. The perimeter-propagation time is defined as the time it takes the leading edge of an optical pulse to propagate from the center of the optical coupler 1006 around the perimeter back to the same location but reaching said location from a different optical coupler 1006 port as is indicated with the arrow 1011. The perimeter-propagation time 1011 is denoted $n_{11}\tau$, where in one embodiment $n_{11}$ is an integer, and in another embodiment $n_{11}$ is a real number. A differential waveguide section 1003A/B comprises of two waveguide sections 1003A and 1003B terminated with an optical coupler on each side, as is illustrated with optical couplers 1006 and 1009 in FIG. 10. Each of the branches 1003A and 1003B of the differential waveguide section 1003A/B have a different optical path length and hence the optical propagation delay between the two branches is different. As shown in FIG. 10, the optical path duration, i.e., the delay of branch 1003A is denoted $n_{10}\tau$, while the optical path duration, i.e., the delay of branch 1003B is denoted with $n_{12}\tau$. In one embodiment, the difference between the delays of the two branches is proportional to the design time $\tau$, namely, the time intervals 1012 and 1010 between adjacent optical couplers 1006 and 1009 shown with $n_{12}\tau$ and $n_{10}\tau$ are proportional to the design time. In yet another embodiment, the multipliers $n_{10}$, $n_{11}$, and $n_{12}$ are all integers. The high-reflectivity mirror 1002 is realized by coating the edge of the PLC chip 1005 at 1002. The coupling coefficient $\kappa_D$ can be adjusted to optimize the averaging and minimize the loss of this structure.

The principle of operation of this embodiment is described as follows: the incident optical signal 1004 enters the waveguide 1001 and a small fraction is coupled into another section of the central waveguide 1001. The main signal propagates further, while the coupled power propagates along the delay section of the central waveguide in the opposite direction (towards the input port at 1004). Providing a multiplicity of couplings produces a wide range of delay times all related to the design time which in turn returns an averaged incident signal to the input port 1004. In one embodiment, the high-reflectivity mirror 1002 is omitted and the waveguide exit at the same location is used as an output, hence the structure is a modulation-averaging transmitter.

In all embodiments shown in FIGS. 6, 7, 8, and 10 the high-reflectivity mirrors are shown as being made by coating the edge of the PLC chip. In one embodiment, the high-reflectivity mirrors are deposited on the polished edges of the PCL chip. The high-reflectivity mirrors may be realized as dielectric coatings or by metal coating the chip edge. In yet another embodiment, the reflectors are realized by using distributed Bragg structures embedded into the PLC waveguides. In one embodiment, any one of the high-reflectivity mirrors used in the embodiments A, B, C, or D may be implemented as a depolarizing mirror by either adding a depolarizer externally or integrating it into the PLC, which includes integrating a Faraday mirror into the PLC waveguides.

In one embodiment, a waveguide structure comprises (i) a four-port optical coupler, said four ports on said optical coupler numbered with integers so that optical signals incident on any one of said ports are coupled to ports of different parity; (ii) a waveguide input port optically coupled to one of said four ports; (iii) a first waveguide segment terminated with high-reflectivity mirror optically coupled to another port of said four ports; (iv) a second waveguide segment; (v) wherein said second waveguide segment is connected to two of said four ports with same parity. In another embodiment, said waveguide structure is configured for use with intensity modulated optical signal having a central wavelength and a symbol rate, and said second waveguide segment having optical-signal propagation delay, wherein a product of said optical-signal propagation delay and said symbol rate is substantially equal to an integer.

In one embodiment, a waveguide structure comprises (i) at least two four-port optical couplers, said four ports on each of said at least two optical couplers numbered with integers so that optical signals incident on any one of said ports are coupled to ports of different parity; (ii) a first waveguide segment having a first propagation delay connected between two ports each port on one of said two optical couplers and each port having a first parity; (iii) a second waveguide segment having a second propagation delay connected between another two ports each port on one of said two optical couplers and each port having said first parity; (iv) a third waveguide segment characterized with third propagation delay connected between another two ports on one of said two optical couplers between two ports of parity opposite to said first parity; wherein (v) said first propagation delay is different from said second propagation delay. In one embodiment, in said waveguide structure the difference between said first propagation delay and said second propagation delay divided by said third propagation delay is substantially equal to a ratio of two integers equal or smaller than 10. This range covers at least one practical range of geometries that may be used in this embodiment. In another embodiment, in said waveguide structure said first waveguide segment, said at least one second waveguide segment, and said at least one four-port optical coupler are disposed on a planar-lightwave circuit chip.

In one embodiment, a waveguide structure is configured for use with intensity modulated optical signal having a central wavelength and a symbol rate, wherein products of said symbol rate with said first propagation delay, said second propagation delay, and said third propagation delay are all substantially equal to integers.

Embodiment E

Integrated AWG and Modulation-Averaging Reflector

Figure 4:
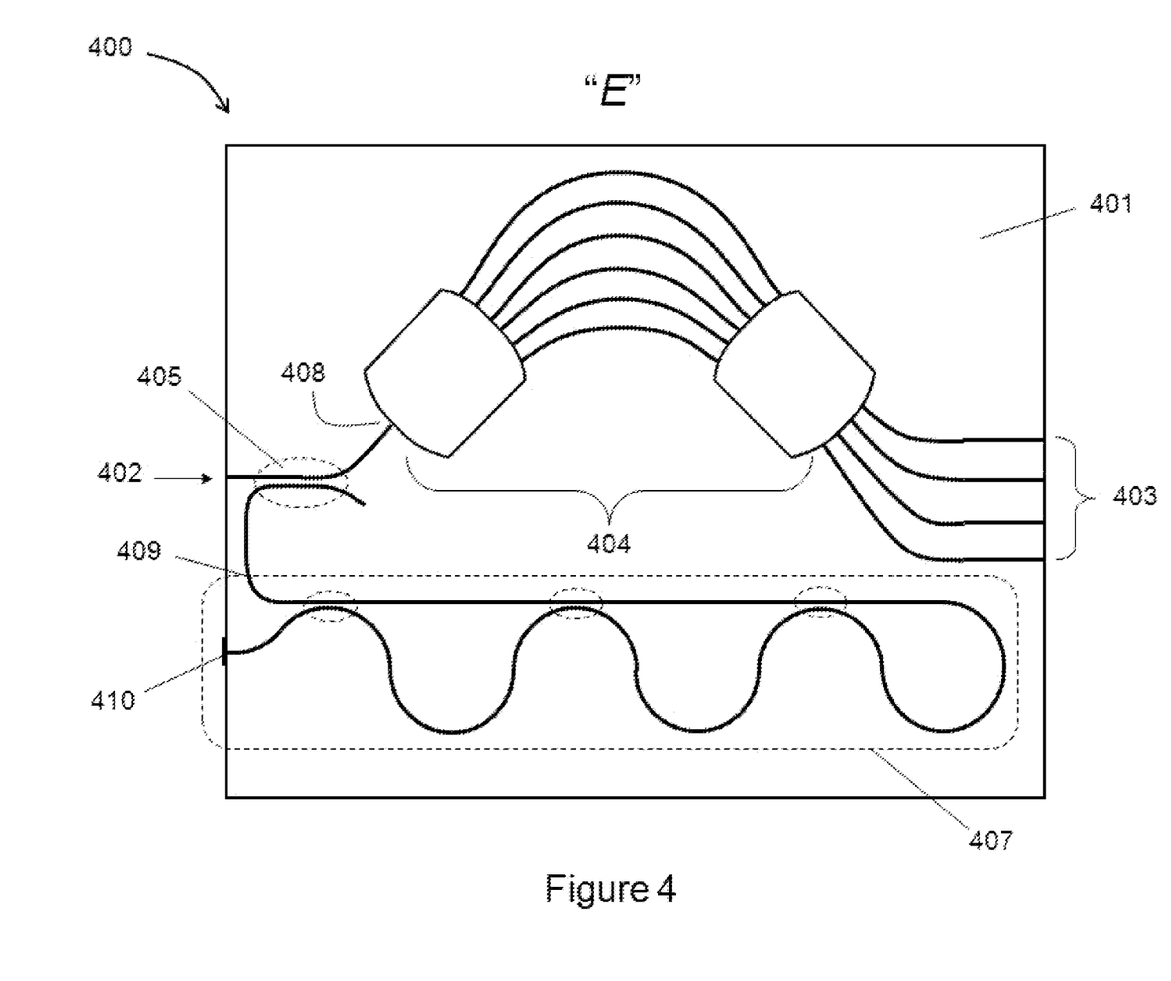
FIG. 4: One embodiment of planar lightwave circuit chip with integrated array-waveguide grating, optical coupler, and a modulation-averaging reflector.

FIG. 4 illustrates an exemplary view on one embodiment E of an array waveguide grating 404 integrated with a modulation averaging reflector 407 on the same planar lightwave circuit chip 401. The integrated chip is referred to as chip 400. In addition to the array waveguide grating 404 and the modulation averaging reflector 407, the chip 401 features an optical coupler 405 that allows some of the optical power emanating from the common port 408 of the AWG 404 to exit the chip 401 and the other to reach a modulation averaging reflector 407 integrated on the same chip 401. The optical coupler 405 is furthermore characterized with an output coupling coefficient C which states how much of optical power emanating from the common port 408 is coupled to the exit port 402. Consequently, the amount of power coupled from the common port 408 to the array reflector 407 is given by 1−C, and the amount of power returned to the common port 408 from the modulation averaging reflector 407 is proportional to $(1-C)^2$. One of the ports of the output coupler 405 is optically coupled to the input port 409 of the modulation averaging reflector 407. The modulation averaging reflector 407 includes features a high-reflectivity mirror 410 it is end. The distribution side of the AWG 404 features plurality of distribution ports 403 each of which couples to a different wavelength. There is more than one way to implement the modulation averaging reflector 407 in PLC technology. FIG. 4 shows Embodiment D in place of 407, but it is clear that one of the disclosed embodiment of the modulation averaging reflector (A, B, C, or D) may be implemented in place 407. Furthermore, it is clear that elements of each of the embodiments A, B, C, and D, may be combined to form a modulation averaging reflector and that that combined reflector may be integrated with an array waveguide grating and optical coupler without departing from the disclosed invention.

In one embodiment, a waveguide structure is configured for use with intensity modulated optical signal having an optical bandwidth centered at a center wavelength and a symbol rate, comprising (i) a central waveguide having an input port and a reflective end; (ii) a plurality of energy-coupling elements disposed along said central waveguide and between said input port and said reflective end; wherein (iii) a product of a propagation delay between any two adjacent energy-coupling elements and the optical bandwidth (expressed in frequency) is substantially larger than unity.

In one embodiment, a planar lightwave circuit chip has a smooth edge and any high-reflectivity mirrors are disposed on said smooth edge. In yet another embodiment, a planar lightwave circuit includes a modulation-averaging reflector, an output optical coupler, and an array-waveguide grating. In yet another embodiment, said array-waveguide grating is an athermal array waveguide grating. In yet another embodiment, said planar lightwave circuit chip is used in a wavelength-division-multiplexer passive optical networks system (WDM-PON).

In one embodiment, a planar lightwave circuit chip comprises (i) an array-waveguide grating having at least a grating-common port; (ii) an optical coupler having a coupler-common port, a working port, and a output port, said coupler-common port optically coupled to said grating-common port; (iii) an modulation-averaging reflector optically coupled to said working port.

Depolarizers and Faraday Rotating Mirrors

Referring back to FIG. 1, in one embodiment, high-reflectivity mirror 108 includes a Faraday rotator which in turn turns the polarization by 90 degrees and this, after multiple reflections in the modulation averaging reflector, depolarizes the light reflected on the high-reflectivity end of the modulation-averaging reflector 102. In this embodiment, the Faraday rotator is positioned at the end of the modulation averaging reflector 102 and serves the same purpose as the depolarizer 117. In another embodiment, a Faraday rotator is positioned at the beginning of the modulation averaging reflector 102 and serves the same purpose as the depolarizer 117. In yet another embodiment, a Faraday rotator is positioned within the modulation averaging reflector 102 and serves the same purpose as the depolarizer 117. The depolarizer 118 is referred to as the "depolarizer in the output path", while the depolarizer 117 or depolarizer placed at the end of the reflector 102 is referred to as a "depolarizer in the self-seeding path". In one embodiment, the optical source 100 employs the first depolarizer 118, but not the second depolarizer 117. In yet another embodiment, the optical source 100 employs the second depolarizer, but not the first depolarizer, and finally in one embodiment the optical source 100 employs no depolarizer. The selection between these options depends on how critical is the desired degree of polarization of the output beam 112, and how polarization selective is the gain medium 103 (RSOA).

The invention claimed is:

1. An optical waveguide component configured for operation with amplitude modulated optical signals at a line rate, said optical waveguide component comprising,
  a first optical waveguide segment having a first port and a second port; and
  a plurality of second optical waveguides each forming a closed loop, each of said second optical waveguides electromagnetically coupled to said first optical waveguide exactly once, and each of said closed loops having a round trip time;
  wherein a product of said line rate and each of said round-trip times is equal to or greater than unity.

2. The optical waveguide component of claim 1, wherein said product is substantially equal to a natural number.

3. The optical waveguide component of claim 1, wherein said optical waveguide component is disposed on a planar lightwave circuit chip.

4. The optical waveguide component of claim 1, wherein said second port is terminated with a highly reflective structure.

5. The optical waveguide component of claim 4, wherein said optical waveguide component is disposed on a planar lightwave circuit chip having an optically flat edge and said highly reflective structure comprises a coating disposed on said optically flat edge.

6. A planar lightwave circuit comprising,
  an optical coupler with at least one coupler-common port and two coupler-exit ports;
  an array-waveguide grating having a grating-common port and a plurality of wavelength-specific ports, said grating-common port optically connected said coupler-common port;
  a first optical waveguide segment having a first port and a reflective end, said first port optically connected to one of said coupler-exit ports;
  a high-reflectivity structure disposed at said reflective end; and
  a plurality of second optical waveguide segments each forming a closed loop, each of said closed loops having a round trip time;
  wherein each of said second optical waveguide segments is electromagnetically coupled to said first optical waveguide segment exactly once.

7. The planar lightwave circuit of claim 6, configured for operation with amplitude modulated optical signals modulated at a line rate, wherein a product of said line rate and each of said round-trip times is equal to or greater than unity.

8. An optical source comprising,
  an optical gain element operatively configured to emit a first amplitude modulated optical signal, said amplitude modulation characterized by a symbol duration;
  a segment of distribution optical fiber coupled to said optical gain element;
  an array-waveguide grating having a grating-common port and a plurality of wavelength-specific ports, said segment of distribution optical fiber coupled to one of said wavelength-specific optical ports;
  an optical coupler having at least a coupler-common port coupled to said grating-common port, one working port, and one output port; and
  a means for averaging said optical signal modulation coupled to said working port.

9. The optical source of claim 8, wherein said means for averaging optical modulation comprises:
  a mirror having a reflectivity value;
  a first optical waveguide segment with an input port and a reflective end, said reflective end terminated with said mirror, and
  a plurality of second optical waveguides, each of said second optical waveguides forming a closed loop having a round-trip time and each of said second optical waveguides being electromagnetically coupled to said first optical waveguide at least once;
  wherein each of said round-trip times is substantially equal to an integer multiple of said symbol duration, said integers not necessarily being equal.

10. The optical source of claim 8, wherein said optical gain element is a reflective semiconductor optical amplifier.

11. The optical source of claim 8, wherein said optical gain element is a semiconductor laser with a low-reflectivity coating on one of its facets.

* * * * *